United States Patent
Chung et al.

(10) Patent No.: US 6,281,695 B1
(45) Date of Patent: Aug. 28, 2001

(54) INTEGRATED CIRCUIT PACKAGE PIN INDICATOR

(76) Inventors: Robbie M. K. Chung; Elynna M. C. Chung, both of 348 Dolphin Isle, Foster City, CA (US) 94404

( * ) Notice: Subject to any disclaimer, the term of this patent is extended or adjusted under 35 U.S.C. 154(b) by 0 days.

(21) Appl. No.: 09/450,924

(22) Filed: Nov. 29, 1999

Related U.S. Application Data

(63) Continuation-in-part of application No. 09/122,421, filed on Jul. 24, 1998, now abandoned, which is a continuation of application No. 08/768,266, filed on Dec. 17, 1996, now abandoned.

(51) Int. Cl.[7] .................................................. G01R 31/02
(52) U.S. Cl. .......................... 324/758; 361/807; 361/809; 361/820; 439/488; 439/491; 324/757; 257/48
(58) Field of Search ..................................... 361/760, 767, 361/783, 807–809, 811, 820; 439/70, 72, 330, 482, 488, 489, 491, 912, 525, 526; 324/72.5, 754, 755, 758, 765, 757; 257/48, 678, 798; 438/14, 15, 106, 800; 29/593

(56) References Cited

U.S. PATENT DOCUMENTS

| | | | |
|---|---|---|---|
| 3,551,878 | * 12/1970 | Rossman | 439/912 |
| 4,055,800 | * 10/1977 | Fisk et al. | 324/72.5 |
| 4,305,767 | * 12/1981 | Corey | 156/62 |
| 4,340,774 | * 7/1982 | Nilsson et al. | 361/783 |
| 4,460,236 | * 7/1984 | Strautz | 439/488 |
| 5,051,870 | * 9/1991 | Companion | 361/767 |
| 5,525,812 | * 6/1996 | Bandzuch et al. | 257/48 |
| 5,557,504 | * 9/1996 | Siegel et al. | 361/772 |
| 5,883,788 | * 3/1999 | Ondricek et al. | 361/768 |
| 5,909,122 | * 6/1999 | Chung et al. | 324/758 |

* cited by examiner

*Primary Examiner*—Jeffrey Gaffin
*Assistant Examiner*—John B. Vigushin
(74) *Attorney, Agent, or Firm*—The Kline Law Firm

(57) ABSTRACT

An integrated circuit package pin indicator that may include probe guides. The indicator includes a top marking plate with indicia for the multiple pins of the IC package. The top plate has individual indicia for each pin, and will have numerical or alpha labels for some or all of the pins, depending on the number of pins present. The top marking plate may include a securing means to attach the top marking plate to the top of the IC package and to hold the top marking plate in place. Each pin marker terminates in a hole or slot that is adapted to guide a probe to a selected pin. The pin indicator can be used with both through hole and surface mount IC boards.

21 Claims, 4 Drawing Sheets

INTEGRATED CIRCUIT PACKAGE PIN INDICATOR

This application is a continuation-in-part of the inventors' U.S. application Ser. No. 09/122,421, filed Jul. 24, 1998 (now abandoned), which is a continuation of inventors' U.S. application Ser. No. 08/768,266, filed Dec. 17, 1996 (now abandoned).

FIELD OF THE INVENTION

The present invention relates generally to the integrated circuit industry, and more particularly is a means of marking the pins of an integrated circuit, and further to guide a metal probe to the appropriate pin while shielding the probe from adjacent pins.

BACKGROUND OF THE INVENTION

Electronic circuit boards utilizing a multitude of integrated circuit (IC) applications are manufactured in huge numbers worldwide. Each of the IC's, or chips, includes a large number of circuits that are accessed by metal leads, or pins. Because of the increasing circuit density of the chips, a growing problem with IC's is identifying the numerous pins and their corresponding circuits.

High pin density also leads to problems when assembling, testing, and/or troubleshooting the boards. To test individual circuits, a metal probe must be brought into contact with the appropriate pin. The greater the pin density, the more difficult it is to achieve contact with the desired pin, and to avoid contact with adjacent pins. It would thus be beneficial to have a means of guiding a probe to only the desired pin.

There are several current art methods directed to the identification of the various pins on a chip. In some cases, a plastic tag is affixed to the pins of an IC in a through hole circuit board. The tag has labelled holes that receive each of the pins of the IC. This type of tag can be very difficult to use when pin density is high, due to the difficulty of aligning the tag holes with the pins. Damage to the IC can occur when attempting to mount the identifying tag. Furthermore, this type of tag can only be used on dip IC's mounted on through hole circuit boards. They cannot be used on any type of surface mount IC's.

A more thorough method of pin identification is disclosed in U.S. Pat. No. 5,051,870, "Electronic Socket Attachment Method and Identification System", issued to John A. Companion, Sep. 24, 1991. The Companion technique envisions a matched set of adhesive labels. A first of the labels is affixed to the top surface of the chip, and a second mirror image label is affixed to lower surface. Additionally, a double-sided adhesive socket sticker is included with the identifying labels.

Clearly, the prior art methodology has technical shortcomings and/or is needlessly complex. Also, there is no convenient technique to establish a probe guide with the pin indicating means. Furthermore, this type of tag can only be used on dip IC's mounted on through hole circuit boards. They cannot be used on any type of surface mount IC's. Furthermore, there is no mechanism for guiding the label sheet so that when it is installed, misalignments between the pin labels and the IC pins do not occur.

There are several current art methods directed to the guiding of a probe to a pin on a chip. One method of this probe guide fixture is disclosed in U.S. Pat. No. 4,055,800, "Test Chip for Electronic Chips", issued to Charles S. Fisk and Dietrich Jung, Oct. 25, 1977. This technique contains a clip like a flat top laundry cloth hanging clip. The end of the clip clamps onto the two sides of an IC. The two sides of the clip contain through holes through which one can make electrical contact with pins on the IC using long probes. Clearly, this prior art methodology has technical shortcomings and complex. First, it will not work for IC's having pins on four sides. Second, it will not be able to secure the clip onto surface mount IC's which could have a height as low as 1.5 mm and a size as large as 10 mm×10 mm.

Another method is disclosed in U.S. Pat. No. 4,460,236, "Test Apparatus for Electrical Circuit Boards", issued to Michael G. Strautz, Jul. 17, 1984. This apparatus contains two separate components. The top component includes a flat top marking plate with metal pins starting at the top marking plate and then extending downward to make contact with the pins on an IC. The second component is a dip IC socket. The top component secures itself by means of clamping its downward wall to the side wall of the second component. Clearly, this prior art methodology has the similar technical shortcomings as mentioned previously. Its IC socket was designed for dip IC's and will not work on surface mount IC's. Also its top component does not have a mechanism for preventing a metal probe from accidentally touching two adjacent pins on the IC simultaneously. Touching two adjacent pins with a probe simultaneously during testing is disastrous and is a very important concern for an engineer or a technician. It happens very often even for a highly skillful engineer or technician. This is due to a small separation between two adjacent pins of a surface mount IC. The spacing between two adjacent pins can be less than 0.5 mm.

Accordingly, it is an object of the present invention to provide a simple, accurate means of pin identification on an IC package.

It is a further object of the present invention to provide a means of guiding a probe to a selected pin, and reducing the possibility of contact with an adjacent pin.

It is a still further object of the present invention to provide an identification method that is easily affixed to an IC package.

SUMMARY OF THE INVENTION

The present invention is an integrated circuit package pin indicator that may include probe guides. The indicator includes a top marking plate with indicia for each of the multiple pins of the IC package. The top plate will have numerical or alpha labels for some or all of the pins, depending on the number of pins present. The top marking plate may include a securing means to attach the top marking plate to the top of the IC package and to hold the top marking plate in place. Each pin marker corresponds to a hole or slot that is adapted to guide a probe to a selected pin. The pin indicator can be used with both through hole and surface mount IC boards.

An advantage of the present invention is that the indicator is accurate, and is easily installed on the IC package.

Another advantage of the present invention is that an integral probe guide is provided for a tester or debug operation.

These and other objects and advantages of the present invention will become apparent to those skilled in the art in view of the description of the best presently known mode of carrying out the invention as described herein and as illustrated in the drawings.

DETAILED DESCRIPTION

Figure 1:
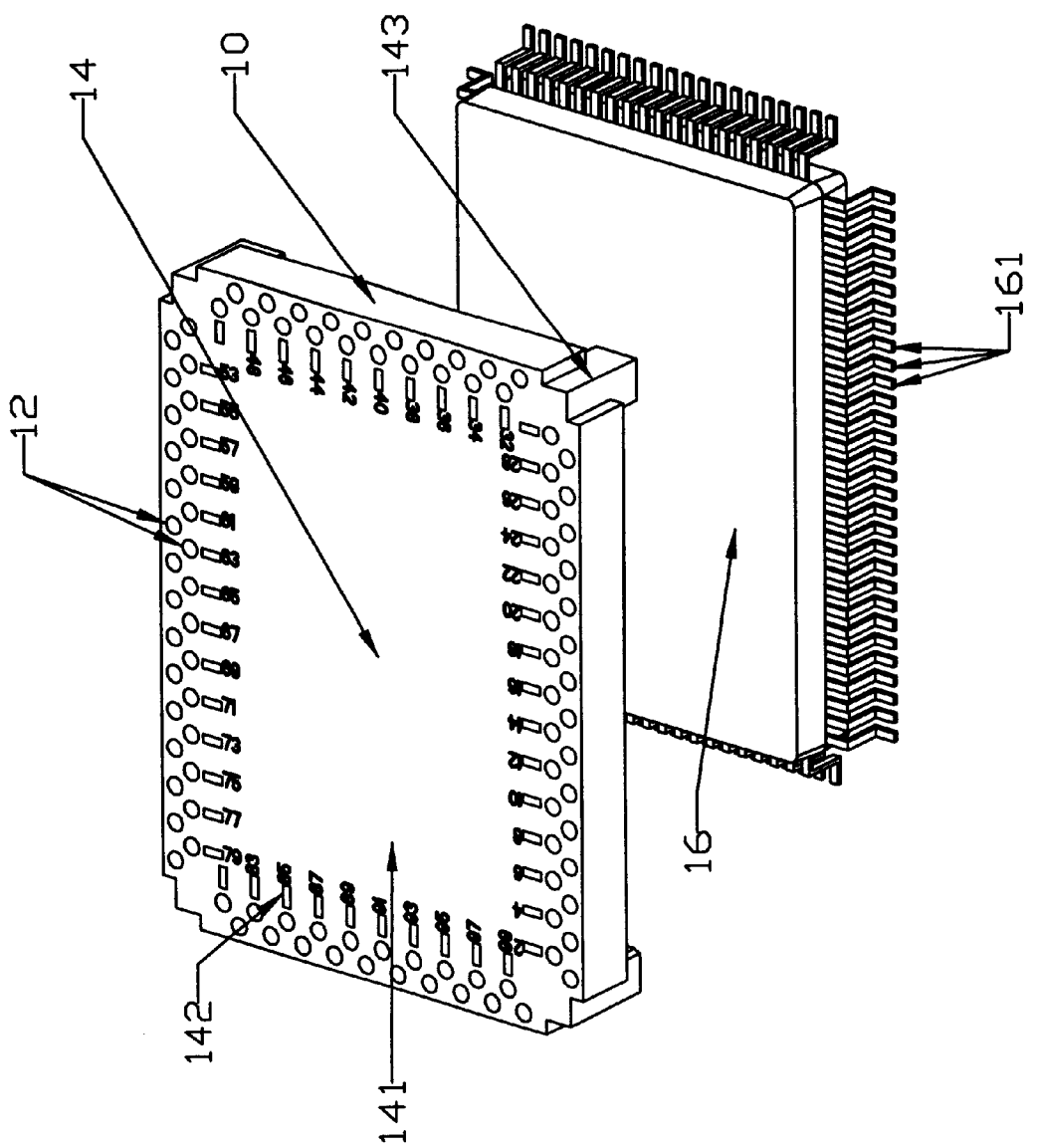
FIG. 1 is a top perspective view of the integrated circuit package pin indicator with probe guides of the present invention.
Figure 2:
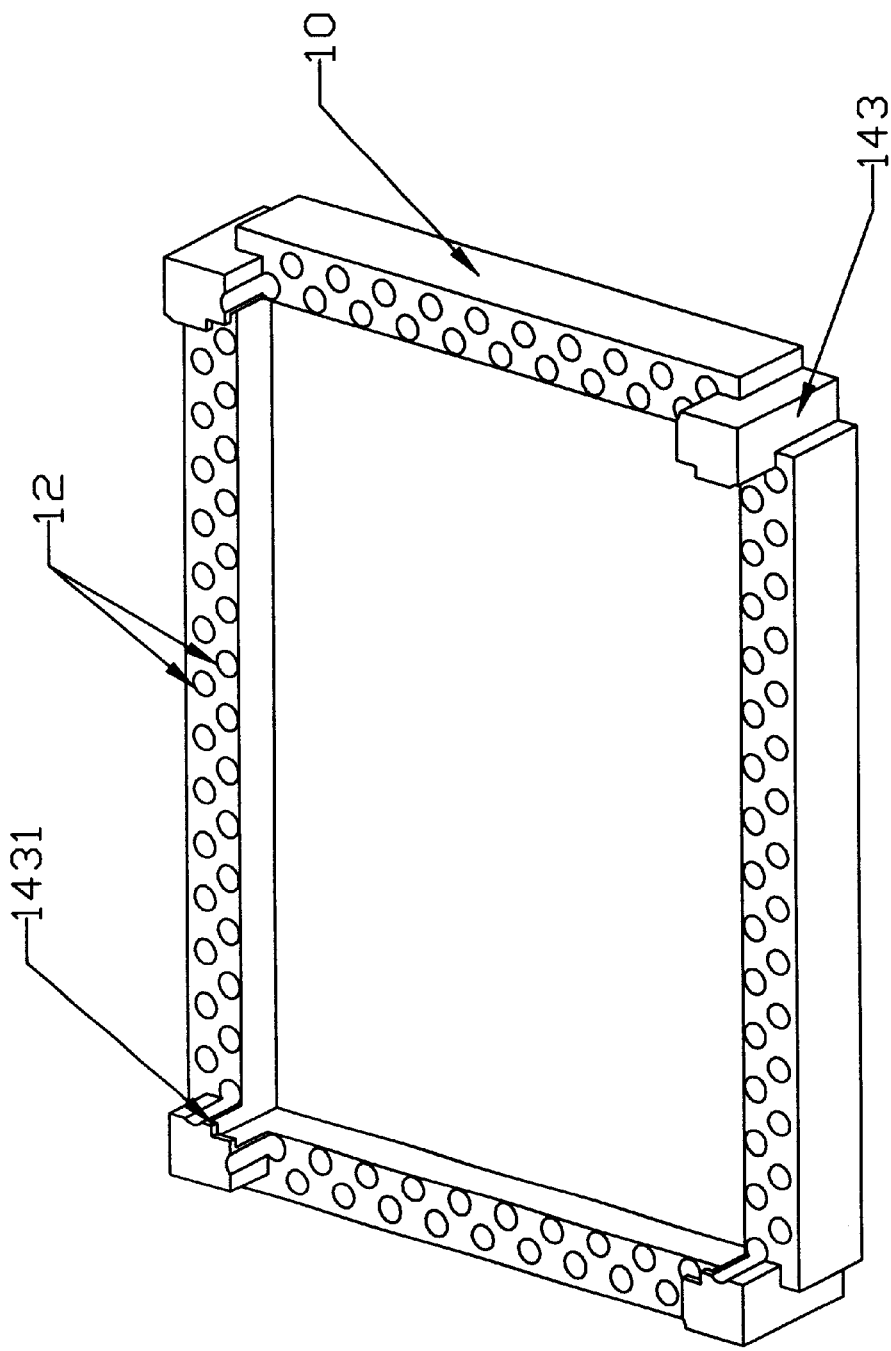
FIG. 2 is a bottom perspective view of the IC package pin indicator with probe guides of the present invention.
Figure 4:
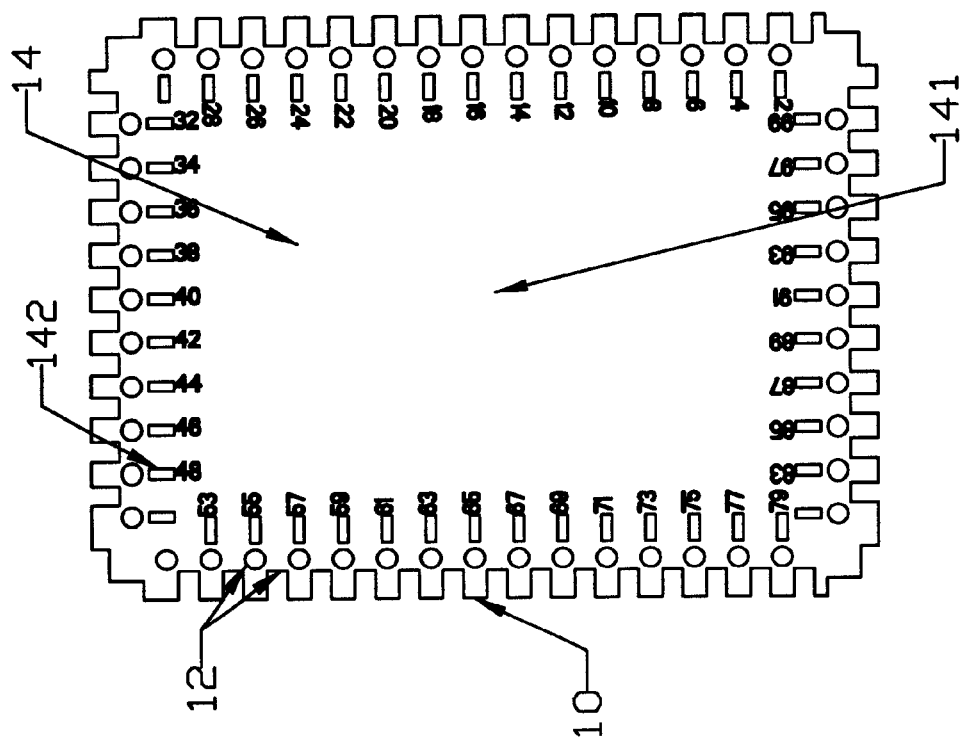
FIG. 4 is a top view of a second embodiment of the pin indicator of the present invention.
Figure 3:
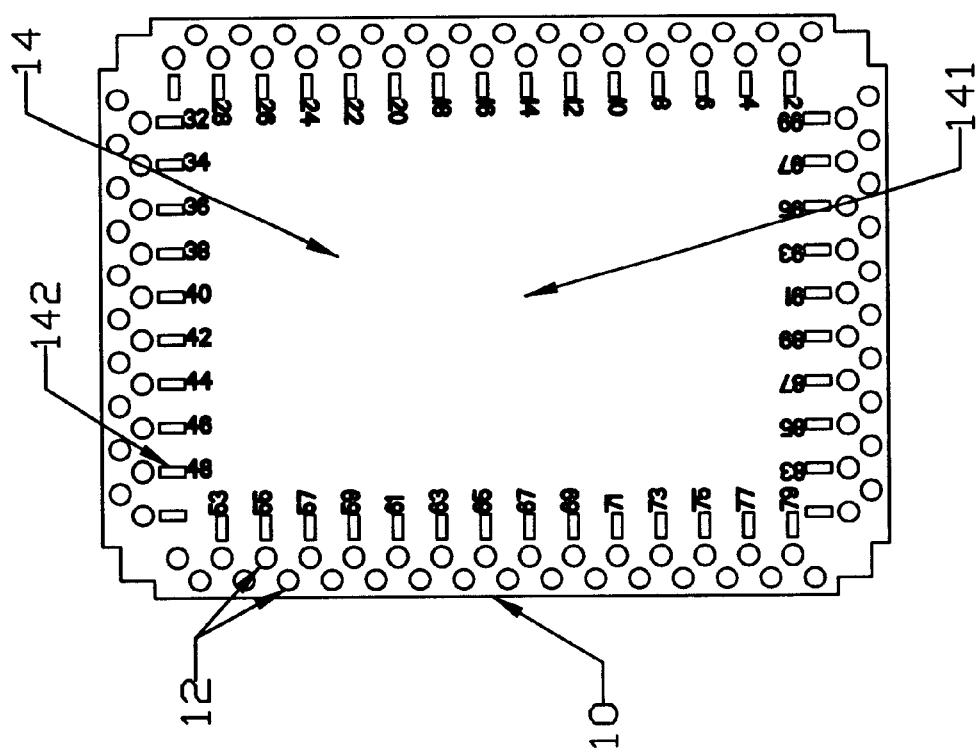
FIG. 3 is a top view of a first embodiment of the pin indicator of the present invention.
Figure 5:
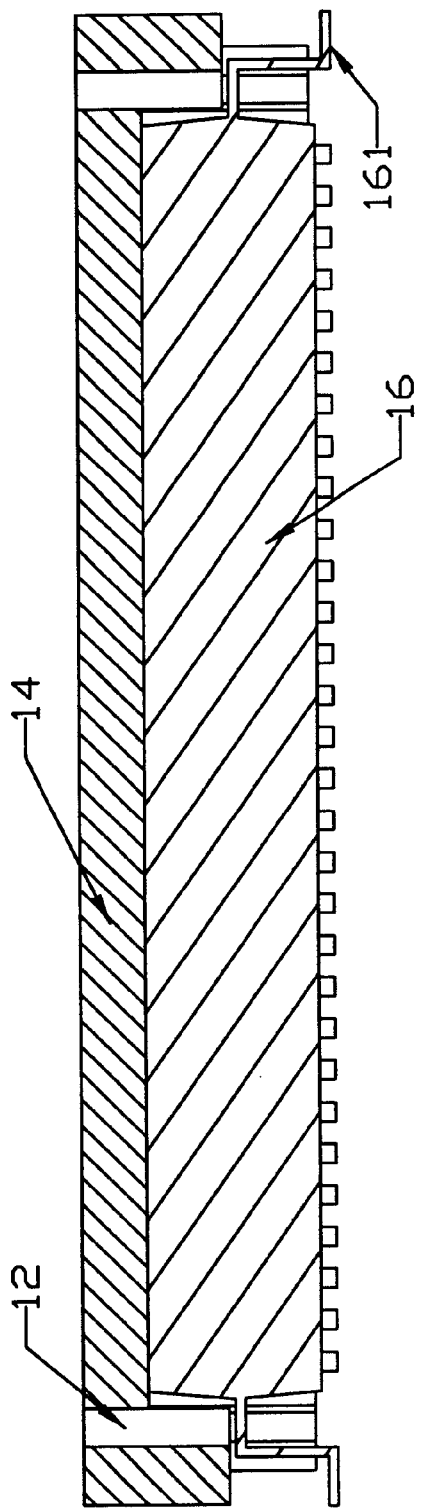
FIG. 5 is a cross section of the pin indicator affixed to an IC package.
Figure 6:
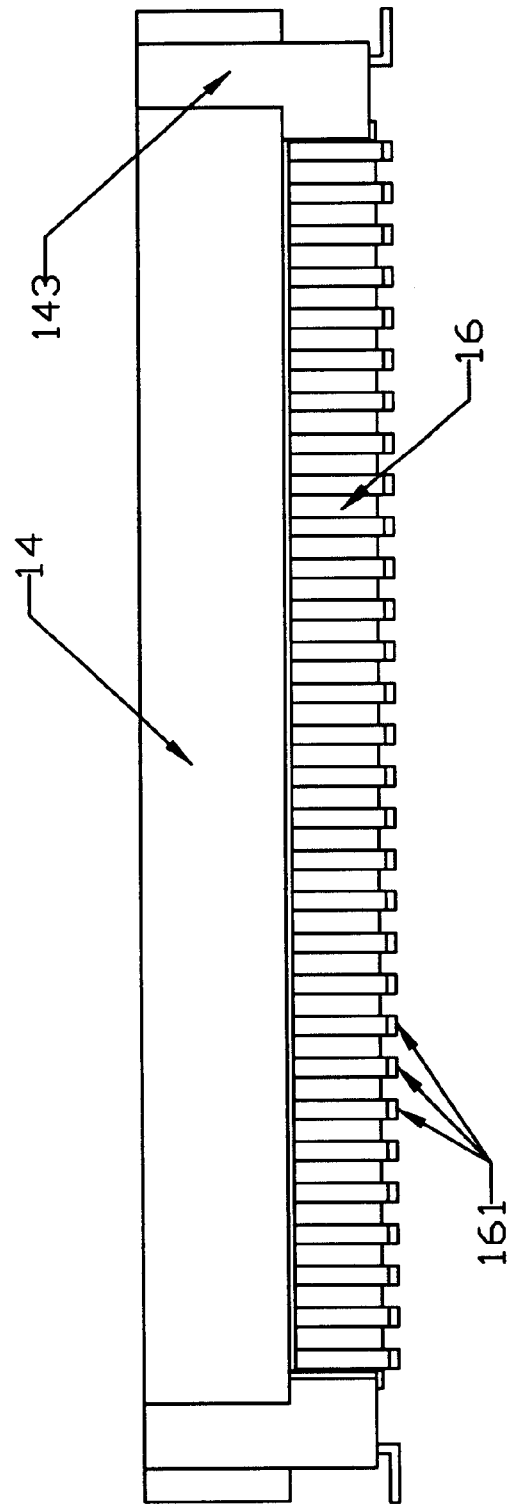
FIG. 6 is a side view of the pin indicator affixed to an IC package via securing means.

The present invention is an integrated circuit package pin indicator 10 that may include probe guides 12. The pin indicator 10 includes a top marking plate 14 with indicia for the multiple pins of the IC package 16.

A top surface 141 of the top plate 14 will generally have individual indicia 142 corresponding to each pin 161 of the IC 16. However, in order to reduce crowding on the top surface 141, only a selected number of the pins 161 will have numerical or alpha labels 142 when a large number of pins 161 are present on the board.

The top plate 14 may be secured to the IC package 16 by adhesive, double sided tape(s) or friction. The top plate 14 may be aligned with the IC package 16 by a physical aligning means 143. While the aligning means 143 could be a solid wall extending downward from the top plate 14, it more usually will be one or more downward extending legs. The legs 143 may be angled so that the tap plate 14 is properly aligned with the IC package 16 to account for the minute size variations of the IC package 16 due to manufacture tolerance.

The legs 143 may also have a projection 1431 on an inner surface to more properly align with the IC package 16.

The top marking plate 14 may also include probe guide means 12 that comprise a plurality of holes or slots that are situated in positions corresponding to the positions of the subject pins of the IC. If the guide means 12 are holes, they are located on a top surface of the top marking plate 14. If the guide means 12 are slots, they are open to the sides of the top marking plate 14. The holes or slots of the guide means 12 may be of any shape desired by the user of the device.

The holes or slots of the guide means 12 are in communication with the pins 161 so that a probe inserted into a selected guide means 12 will make electrical contact with the corresponding pin 161. In this way, testing and/or troubleshooting of the IC package is greatly facilitated.

The above disclosure is not intended as limiting. Those skilled in the art will readily observe that numerous modifications and alterations of the device may be made while retaining the teachings of the invention. Accordingly, the above disclosure should be construed as limited only by the restrictions of the appended claims.

We claim:

1. An integrated circuit package pin indicator comprising:

a top marking plate including a plurality of indicia, each of said indicia corresponds to a location of a pin of an integrated circuit package, and said top marking plate is a planar element with an upper planar surface and an opposing lower planar surface, said lower planar surface is affixed directly to a planar top surface of said integrated circuit package; wherein said top marking plate includes a plurality of probe guides, each of said probe guides is situated at a position corresponding to said locations of said pins, said probe guides each comprise an opening in said top marking plate of said pin indicator; such that each said opening is in communication with a corresponding pin such that a probe inserted into a selected probe guide makes electrical contact with said corresponding pin.

2. The pin indicator of claim 1 wherein:

said pin indicator includes an alignment means to accurately align said indicator with said integrated circuit package, said alignment means comprises at least one downward extending element to align said pin indicator with said top surface of said integrated circuit package.

3. The pin indicator of claim 2 wherein:

said downward extending element includes a projection that contacts said integrated circuit package.

4. The pin indicator of claim 2 wherein:

said alignment means is located at a corner of said pin indicator.

5. The pin indicator of claim 2 wherein:

said alignment means is located on a side of said pin indicator.

6. The pin indicator of claim 1 wherein:

said pin indicator includes a securing means to physically attach said pin indicator to said integrated circuit package.

7. The pin indicator of claim 6 wherein:

said securing means includes adhesive means to adhere said pin indicator to said top surface of said integrated circuit package.

8. The pin indicator of claim 7 wherein:

said adhesive means is adhesive tape.

9. The pin indicator of claim 7 wherein:

said securing means is glue.

10. The pin indicator of claim 7 wherein:

said securing means is cement.

11. The pin indicator of claim 1 wherein:

said pin indicator includes an alignment means to accurately align said indicator with said integrated circuit, said alignment means comprises at least one downward extending element to align said pin indicator with said top surface of said integrated circuit package.

12. The pin indicator of claim 11 wherein:

said downward extending element includes a projection that contacts said integrated circuit package.

13. The pin indicator of claim 11 wherein:

said alignment means is located at a corner of said pin indicator.

14. The pin indicator of claim 11 wherein:

said alignment means is located on a side of said pin indicator.

15. The pin indicator of claim 1 wherein:

said pin indicator includes a securing means to physically attach said pin indicator to said integrated circuit package.

16. The pin indicator of claim 15 wherein:

said securing means includes adhesive means to adhere said pin indicator to said top surface of said integrated circuit package.

17. The pin indicator of claim 16 wherein:
said adhesive means is adhesive tape.

18. The pin indicator of claim 16 wherein:
said securing means is glue.

19. The pin indicator of claim 16 wherein:
said securing means is cement.

20. The pin indicator of claim 1 wherein:
said openings are holes that pass through said top marking plate.

21. The pin indicator of claim 1 wherein:
said openings extend to a side of said top marking plate.

\* \* \* \* \*